(12) United States Patent
Partee

(10) Patent No.: US 10,634,731 B2
(45) Date of Patent: *Apr. 28, 2020

(54) SYSTEMS AND METHODS FOR TESTING POWER SUPPLIES

(71) Applicant: FedEx Supply Chain Logistics & Electronics, Inc., Fort Worth, TX (US)

(72) Inventor: Jimmie Paul Partee, Double Oak, TX (US)

(73) Assignee: FedEx Supply Chain Logistics & Electronics, Inc., Forth Worth, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/408,327

(22) Filed: May 9, 2019

(65) Prior Publication Data
US 2019/0265311 A1 Aug. 29, 2019

Related U.S. Application Data

(63) Continuation of application No. 15/678,917, filed on Aug. 16, 2017, now Pat. No. 10,330,740, which is a continuation of application No. 13/434,275, filed on Mar. 29, 2012, now Pat. No. 9,753,095, which is a continuation-in-part of application No. 12/761,003, filed on Apr. 15, 2010, now Pat. No. 8,988,098.

(51) Int. Cl.
 *G01R 31/40* (2020.01)
(52) U.S. Cl.
 CPC .................. *G01R 31/40* (2013.01)
(58) Field of Classification Search
 CPC .............. G01R 31/3606; G01R 31/362; G01R 31/3627; G01R 31/36; G01R 31/02; G01R 31/40; G01R 35/00

USPC ....... 326/426–437, 439–450, 762.01, 764.01
 See application file for complete search history.

(56) References Cited

U.S. PATENT DOCUMENTS

| | | | |
|---|---|---|---|
| 3,723,863 A | 3/1973 | Myers | |
| 3,783,340 A | 1/1974 | Becker | |
| 3,858,159 A * | 12/1974 | Worth | .......... H01R 12/675 |
| | | | 439/399 |
| 4,357,574 A | 11/1982 | Takamisawa et al. | |
| 4,540,940 A | 9/1985 | Nolan | |

(Continued)

OTHER PUBLICATIONS

Sotcher Measurement, Inc., The Short Stop Model 350, AC Leakage Current Tester, Oct. 11, 1999, pp. 1-2, http://sotcher.com/ett/350.html.

(Continued)

*Primary Examiner* — Giovanni Astacio-Oquendo
(74) *Attorney, Agent, or Firm* — McGuire Woods LLP

(57) ABSTRACT

A system and method for testing a power supply. A selection of one or more power supplies to test is received. A tester is automatically configured to test the one or more power supplies utilizing test parameters associated with the selection. A power-end of each of the one or more power supplies is received in power ports of the tester. An adapter-end of each of the one or more power supplies is received in adapter ports of the tester. The one or more power supplies are automatically tested utilizing test parameters. Performance characteristics of the loop one or more power supplies are measured during testing. Indications are given whether each of the one or more power supplies past the testing.

20 Claims, 8 Drawing Sheets

(56) References Cited

U.S. PATENT DOCUMENTS

| | | | |
|---|---|---|---|
| 5,477,152 A | 12/1995 | Hayhurst | |
| 5,710,701 A | 1/1998 | Brown | |
| 6,054,849 A | 4/2000 | Collier et al. | |
| 6,239,579 B1 | 5/2001 | Dunn et al. | |
| 6,323,657 B1 | 11/2001 | Chang | |
| 6,351,130 B1 | 2/2002 | Preiser et al. | |
| 6,392,317 B1* | 5/2002 | Hall | E21B 17/003 174/47 |
| 6,441,584 B1 | 8/2002 | Crass | |
| 6,639,409 B2 | 10/2003 | Morimoto et al. | |
| 6,992,487 B1 | 1/2006 | Steinke | |
| 7,112,988 B2 | 9/2006 | Xiao | |
| 7,173,428 B2 | 2/2007 | Hurwiez | |
| 7,245,119 B2 | 7/2007 | Ivannikov et al. | |
| 7,365,561 B2* | 4/2008 | Ito | G01R 1/06761 324/754.07 |
| 7,392,147 B2 | 6/2008 | Lo et al. | |
| 7,436,200 B1 | 10/2008 | Jacobsen et al. | |
| 7,570,073 B2 | 8/2009 | Xiao et al. | |
| 7,768,292 B1 | 8/2010 | Koch | |
| 7,821,234 B2 | 10/2010 | Moriya | |
| 7,970,563 B2 | 6/2011 | Fausak et al. | |
| 8,427,182 B2 | 4/2013 | Amanuma | |
| 8,498,830 B2 | 7/2013 | Landry et al. | |
| 8,547,131 B2 | 10/2013 | Wang et al. | |
| 8,589,110 B2 | 11/2013 | Liu et al. | |
| 2001/0031040 A1* | 10/2001 | Kaine | H04M 1/24 379/21 |
| 2002/0145435 A1 | 10/2002 | Bald et al. | |
| 2003/0178968 A1 | 9/2003 | Sakakibara et al. | |
| 2003/0184306 A1 | 10/2003 | Bertness et al. | |
| 2003/0188206 A1 | 10/2003 | Odaohhara | |
| 2005/0007074 A1 | 1/2005 | Koster et al. | |
| 2005/0120196 A1 | 6/2005 | Zito | |
| 2005/0184593 A1 | 8/2005 | Gottlieb et al. | |
| 2006/0178047 A1* | 8/2006 | Croan | H01R 13/6272 439/578 |
| 2008/0061797 A1 | 3/2008 | Xiao et al. | |
| 2008/0122477 A1 | 5/2008 | Yuan et al. | |
| 2008/0129123 A1 | 6/2008 | Jia | |
| 2008/0164762 A1 | 7/2008 | Pecile | |
| 2008/0270079 A1 | 10/2008 | Delory | |
| 2009/0251127 A1 | 10/2009 | Kim | |
| 2009/0261843 A1 | 10/2009 | Li | |
| 2010/0007370 A1 | 1/2010 | Dishman et al. | |
| 2010/0141266 A1 | 6/2010 | Cui et al. | |
| 2012/0307981 A1* | 12/2012 | Larkin | H01H 9/0228 379/27.01 |

OTHER PUBLICATIONS

Jim McBride, Charger test technique employs power-supply current-sinking capability, Test & Measurement World, Dec. 1, 200, http://www.tmworld.com/article/325575-Power_supply_simulates_battery.php.

Saab et al, Battery Emulation Circuit Speeds, Power Electronics Technology, May 2008, pp. 14-17, http://powerelectronics.com/portable_power_management/battery_charger_ics/805PET20battery-charger-testing.pdf.

Geiper Patentability Search Report dated Feb. 10, 2010.

* cited by examiner

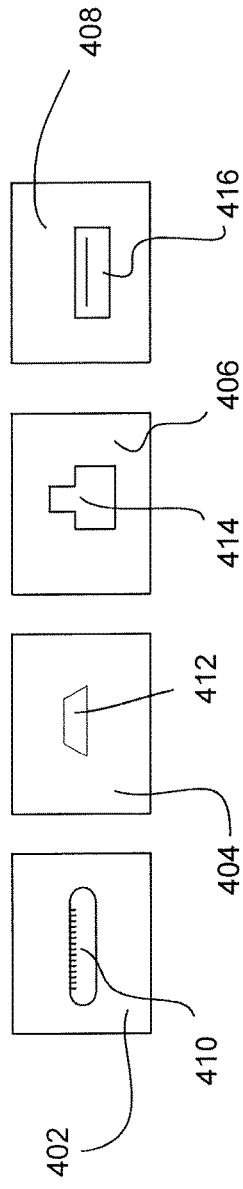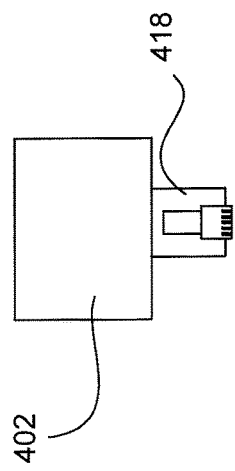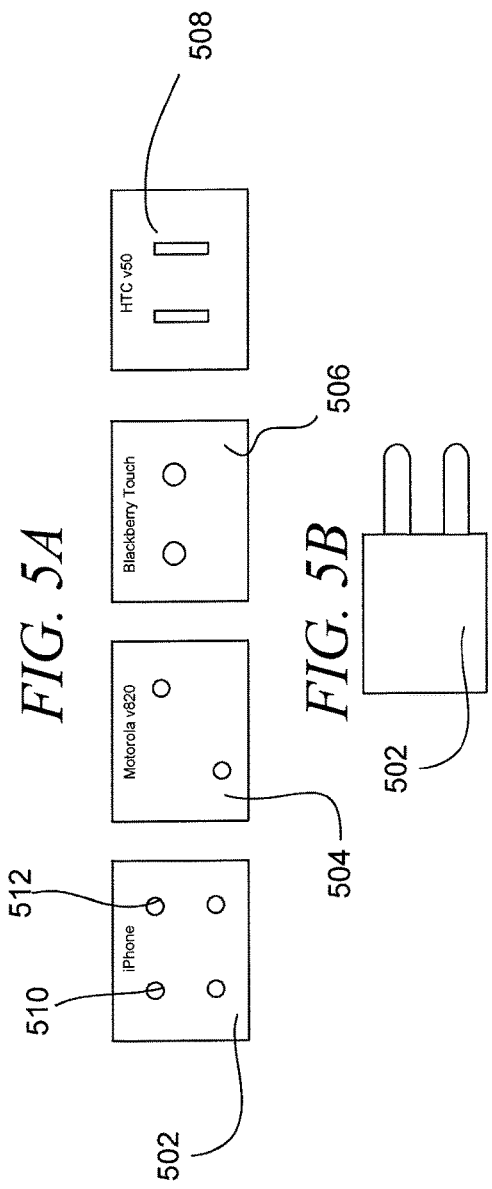

SYSTEMS AND METHODS FOR TESTING POWER SUPPLIES

CROSS REFERENCE TO RELATED APPLICATIONS

This application is a Continuation of U.S. patent application Ser. No. 15/678,917 filed on Aug. 16, 2017, which is a Continuation of U.S. patent application Ser. No. 13/434,275 filed on Mar. 29, 2012, now issued as U.S. Pat. No. 9,753,095, entitled: SYSTEMS AND METHODS FOR TESTING POWER SUPPLIES which is a Continuation-in-Part of U.S. patent application Ser. No. 12/761,003 filed on Apr. 15, 2010, now issued as U.S. Pat. No. 8,988,098 on Mar. 24, 2015 entitled: SYSTEMS AND METHODS FOR MODULAR TESTING OF CHARGERS the entire teachings of which are incorporated herein.

BACKGROUND

The use of and development of electronics equipment has grown nearly exponentially in recent years. The growth is fueled by better electronics hardware and software available to organizations and consumers and the increased appetite for mobile devices. In particular, electronic and mobile devices, such as cell phones, media players, medical equipment, and other similar elements that are battery powered are being released nearly constantly. Battery powered electronic devices typically require a power supply or charger that is utilized to power and/or charge the battery powering the mobile device by converting electrical energy passing through the charger into chemical or potential utilized by the electronic device and energy stored by the battery, if present.

Millions of battery powered devices and their respective chargers are returned, refurbished, fixed, or otherwise processed each year. Testing power supplies and chargers may be difficult because of the number of devices to be processed, varying interfaces and ports, load compatibility, and functional and non-functional characteristics (i.e., voltage and current). As a result, in many cases re-processed power supplies and chargers are discarded increasing environmental and manufacturing waste.

SUMMARY

One embodiment provides a system and method for testing a power supply. A selection of one or more power supplies to test may be received. A tester may be automatically configured to test the one or more power supplies utilizing test parameters associated with the selection. A power-end of each of the one or more power supplies may be received in power ports of the tester. An adapter-end of each of the one or more power supplies may be received in adapter ports of the tester. The one or more power supplies may be automatically tested utilizing test parameters. Performance characteristics of the loop one or more power supplies may be measured during testing. Indications are given whether each of the one or more power supplies past the testing.

Another embodiment provides a power supply tester. The power supply tester may include a first number of port for receiving an adapter-end of up number of power supplies. The power supply tester may further include a second number of ports in communication with the first number of ports through testing circuit. The second number of ports may be operable to receive a power-end of the number of power supplies for providing an alternating current signal to the number of power supplies. The power supply tester may further include a power generator for providing the AC signal for the number of power supplies being tested. The power supply tester may further include a measurement device for measuring performance information for each of the number of power supplies during testing. The power supply tester may further include a display for displaying the performance information to a user indicating whether each of the number of power supplies passed or failed the testing.

Yet another embodiment provides a power supply tester. The power supply tester may include a first number of ports for receiving an adapter-end of a number of power supplies. The power supply tester may include a second number of ports for receiving a power—and of the number of power supplies for receiving an AC signal. The power supply tester may include a power generator for providing the AC signal for the number of power supplies being tested through the second number of ports. The power supply tester may include a number of testing circuits for testing the number of power supplies utilizing test parameters. The power supply tester may include a measurement device for measuring performance information for each of the number of power supplies during testing. The power supply tester may include a database for storing the performance information associated with each of the number of power supplies. The power supply tester may include a display for displaying the performance information to a user indicating whether each of the number of power supplies passed or failed the testing.

BRIEF DESCRIPTION OF THE DRAWINGS

Illustrative embodiments of the present invention are described in detail below with reference to the attached drawing figures, which are incorporated by reference herein and wherein:

FIG. 4A-B is a pictorial representation of an adapter module in accordance with an illustrative embodiment:

FIG. 5A-B is a pictorial representation of a load module in accordance with an illustrative embodiment:

DETAILED DESCRIPTION OF THE DRAWINGS

Illustrative embodiments provide a modular system for testing power supplies and chargers. The term charger is utilized to generically refer to power supplies, chargers, adapters, or other similar devices, systems, or equipment. In one embodiment, a charger may be tested utilizing a power supply tester or charger tester to determine functionality or nonfunctionality of the charger for use with one or more electronic devices. The charger tester is a device that may be utilized by a user to determine functionality or performance characteristics of a charger. Functionality may be determined based on pre-set criteria or based on the performance characteristics of the charger as measured during simulated operational conditions. Performance characteristics may include current, voltage, impedance, temperature, and other similar electrical characteristics of the charger as measured when a load module is modularly connected to the charger tester.

The charger tester may temporarily power the charger during testing. An adapter module may be connected to the charger tester for receiving an adapter-end of the charger. In another embodiment, the adapter-end may also be connected directly to the charger tester. The adapter module may be selected based on the charger type, battery-powered device for which the charger is utilized (which may include make and model), and other manually or automatically determined information. Similarly, a load or load module may be manually or dynamically applied to the charger by the charger tester to simulate a standard, maximum, or customized load that may be utilized by the charger during operation to determine the performance characteristics. The charger tester may include a number of safety measures including relays, switches, and timers utilized to ensure the safety of the user and continued operation of the charger and charger tester during and after testing of the charger.

Figure 1A:
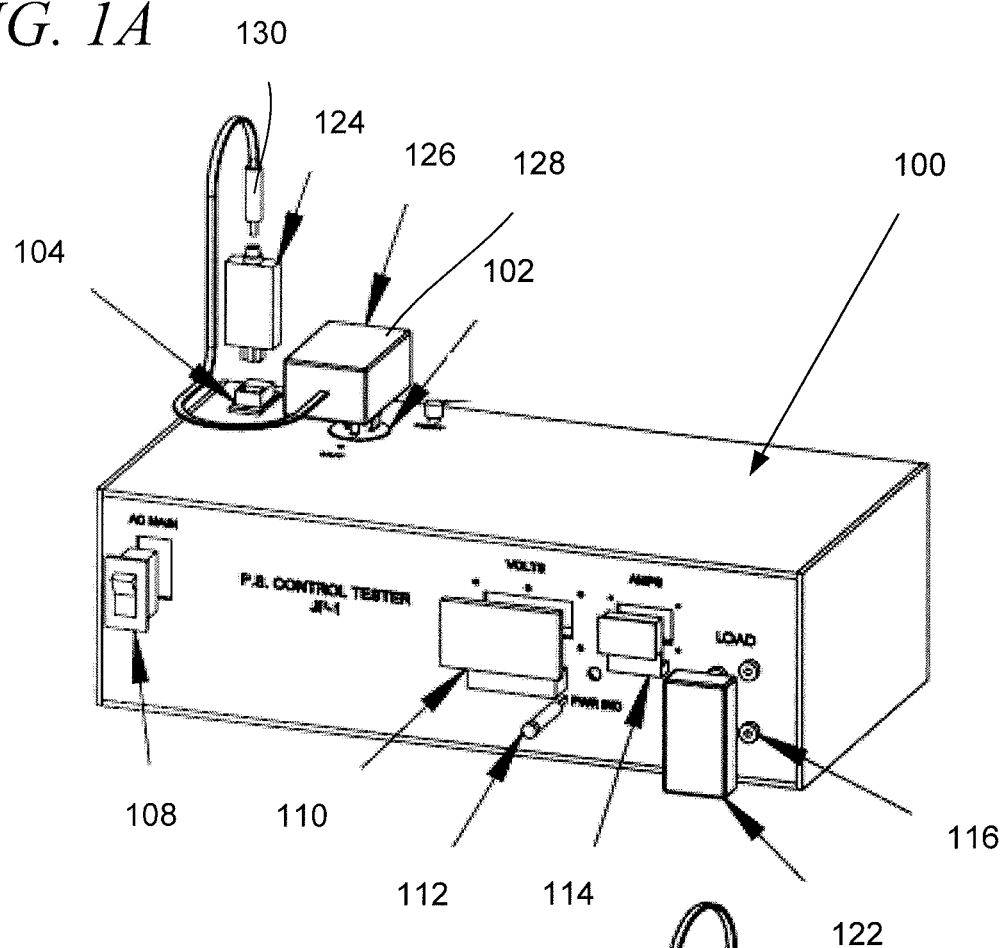
FIG. 1A is a pictorial representation of a front view of a charger tester in accordance with an illustrative embodiment.
Figure 1B:
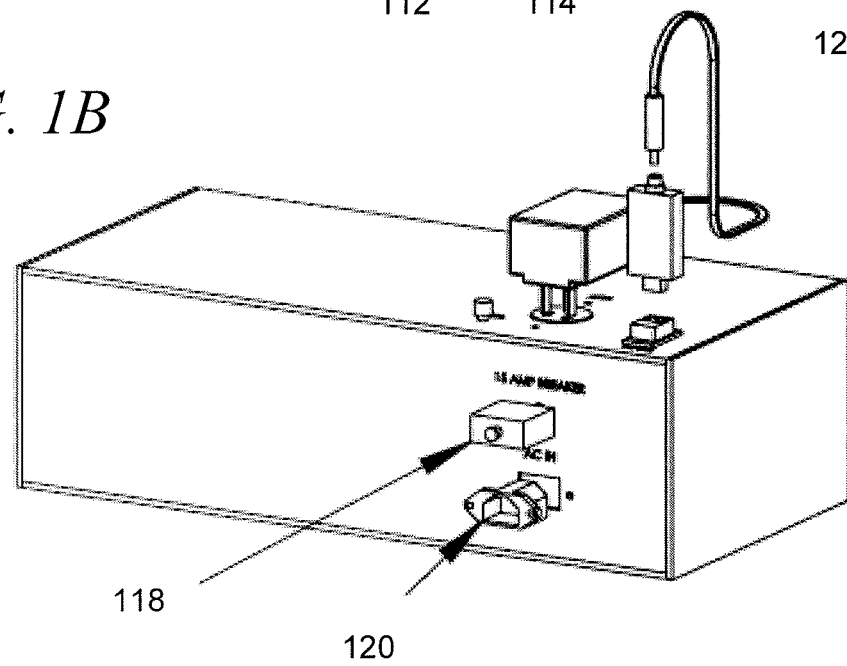
FIG. 1B is a pictorial representation of a rear-view of a charger tester in accordance with an illustrative embodiment.

Referring now to FIGS. 1A-B, one embodiment of a charger tester 100 is illustrated. The charger tester 100 may include any number of components, elements, and configurations. In one embodiment, the charger tester 100 may include an AC test outlet 102, an adapter port 104, a power switch 108, a volt meter 110, a power indicator 112, an ammeter 114, a load port 116, a circuit breaker 118, an AC power inlet 120, a load module 122, an adapter module 124, a charger 126, a power-end 128, and an adapter-end 130.

The charger tester 100 may be modularly configured to test mobile charging devices, such as the charger 126. Typically the charger 126 may be utilized to charge a battery or other energy storage device or to temporarily power an electronic device. For example, the charger 126 may be utilized to charge a cell phone battery. In another embodiment, the charger 126 may be a power plug (e.g. power brick), AC adapter, connector, or power plug for powering or charging any electronic device. For example, the electronic device may be solely powered by the charger 126. The charger tester 100 may be modularly configured to test the charger 126. For instance, the adapter module 124 and the load module 122 may be selected specifically for testing the charger 326. The modular connection of the adapter module 124 and load module 122 provides flexibility for efficiently testing a number of different charger types for reuse rather than discarding or recycling the chargers based on an unknown condition.

The adapter module 124 is an adapter for interfacing the adapter-end 328 of the charger 126 with the charger tester 100 through a port. The adapter module 124 may be adapted to receive the adapter-end 130 of the charger 126. The adapter-end 130 may be a standardized interface, such as those promulgated by a standards body or other technical or industry source, or a proprietary interface, such as those used by numerous electronic device manufacturers. In one embodiment, the adapter-end 130 may represent a mini or micro USB. In particular, the adapter module 124 is configured to connect to the adapter port 104 so that a load and measurements may be made as if the charger 126 was actually powering or charging an electronic device.

The adapter module 124 may be configured to be received by the adapter port 104. In one embodiment, the adapter port 104 is an RJ45 jack/port configured to receive an RJ45 head integrated with the adapter module 124. For example, the adapter port 104 may be a stainless steel port configured for long term repeated use without damaging the adapter port 104 when receiving adapter modules. The adapter port 104 and associated connector of the adapter module 124 may utilize any number of adapter combinations suitable for frequent and extensive testing. In another embodiment, the adapter module 124 may be integrated with the charger tester 100, but may be removed as necessary for testing distinct chargers. The adapter module 124 is further described in FIGS. 4A-B. In one embodiment, the insertion of the adapter-end 130 of the adapter module 124 may activate power through the charger 126 in response to pins 3 and 6 of the adapter module 124 making contact. Contact of the pins at the adapter-end or plugs of the power-end of the charger 126 may be utilized to automatically initiate testing including providing an AC power signal to the charger. In one embodiment, relays may be utilized to implement testing for one or more chargers in response to connection of the charger 126 to the charger tester 100. In another embodiment, one or more of the adapter modules may be an integrated part of the charger tester 100.

The load module 122 is a resistive load that is connectable to the charger 126. The load module 122 may provide a resistive load that simulates the load required to charge or power the mobile device associated with the charger 126. The load module 122 may also be configured to simulate completely emptied batteries, complex impedance and resistance characteristics, and other conditions that the charger 326 may experience in real world environments. In another embodiment, the load module 122 may provide information that may be read by the charger tester 100 to configure a dynamic or programmable load. The load module 122 may provide a physical way for the user to verify the load being applied to the charger 126.

In one embodiment, the load module 122 may be configured to supply +/−10% of the rated load. The rated load may be provided based on original equipment manufacturers (OEM) guidelines or specifications for the associated mobile device. The adapter module 124 and load module 122 are modular and may be easily changed out to test alternative electronic devices providing a user or technician maximum efficiency to test a number of chargers. The load module 122 may be connected to the load port 116 of the charger tester 100. The load module 122 is further described in FIGS. 5A-B. The rated load may also be varied based on the selected load module to test the charger 126 during extreme operating conditions.

For example, the load module 122 may include a D-subminiature electrical connector, such as DB-9 or DE-9 male connector or plug. The load port 116 may likewise be a DB-9 or DE-9 female connector or socket. In one embodiment, the load module 122 may include digital logic, such as a programmable digital-to-analog converter (DAC), that is electronically read by a processor or logic of the charger tester 100 to programmably set the load that is applied to the charger 126. For example, the value stored in the programmable DAC may include a value that is directly or indirectly converted to an amperage applied by the charger tester 100 to the charger 126. In one embodiment, the charger tester 100 may be configured to apply an amperage up to 3 amps.

However, the current may be greater for testing electronic devices with more intense power requirements. The charger tester 100 may be configured to execute a program or logic to interpret the values of the load module 122 to test the charger 126. For example, an operator or administrator may program a number of load modules for testing specific chargers. The load modules may be labeled utilizing fixed label, erasable label, or digital read/out (e.g. a miniature display). As a result, the user may physically select and insert the load module 122 providing a more physical interaction for performing the testing.

The load module 122 and the adapter module 124 may include plastic housings with ergonomics that allow the easy insertion or removal from the charger tester 100. The electrical components of the load module 122 and the adapter module 124 including pins, traces, wires, paths, resistors, circuitry, logic, and other elements may be similarly protected by the housings.

The load port 116 provides a universal configuration for receiving any number of load modules. In one embodiment, the load port 116 may be configured to receive banana jacks. However, the load port 116 may be used to receive any load module 122 suited for electronically connecting a resistance or impedance to the charger 126 that approximates or simulates operation of the charger 126 when charging or powering the mobile device. The load port 116 may be configured to receive two or more connectors that are part of the load module 122 for applying the load to the device. The load port 116 provides flexibility for applying different load modules with different requirements.

The charger 126 is powered through the AC test outlet 102 in response to the adapter module 124 being inserted into the adapter port 104. The AC test outlet 102 is a power outlet configured to power the charger 126 at the designated voltage and current. In one embodiment, the charger tester 100 may include various test outlets or power ports for powering the charger 126 at different voltages or in order to interface with different power adapters. For example, the charger tester 100 may be configured to interface with European devices that may have different voltage and connect requirements and standards. Similarly, the charger tester 100 may include alternative power ports for testing vehicular charging devices, such as an interface for a power port or cigarette lighter of a vehicle. Alternatively, a USB powered port or other alternative powers ports may be provided as well. In one embodiment, the charger tester 100 may utilize multiple test outlets, load and adapter, ports, adapter ports, load ports, various test outlets, power ports, and other components of the charger tester 100 to test multiple devices, simultaneously, serially, or concurrently. For example, a dynamic load of the charger tester 100 may be configured to test multiple chargers of the same type in batches. In another embodiment, distinct charger types may be tested utilizing information, identifiers, testing procedures, parameters, and measurements that are distinct.

The volt meter 110 measures the voltage across the charger 126 while being tested. The ammeter 114 similarly measures the current through the charger 126 during testing. In one embodiment, the volt meter 110 and ammeter 114 include a digital display that indicate on an exterior portion of the charger tester 100 the applicable voltage and current measured by the charger tester 100. The digital display may also indicate whether the charger 126 has passed or failed the applicable test based on manually or automatically determined criteria, tolerances, or thresholds. The volt meter 110 and ammeter 114 may measure and display any number of configured test results including spikes, averages, or other specific tests. The volt meter 110 and ammeter 114 may include multiple components for measuring the performance of multiple chargers simultaneously. The measurements may also be stored in a database during continuous or repeated measurements.

The AC power inlet 120 provides power to the charger tester 100 and indirectly to the AC test outlet 102. The circuit breaker 118 is an automatically-operated electrical switch that protects the charger tester 100 and charger 126 under test from damage caused by overload or a short circuit. The circuit breaker 118 discontinues electrical flow in the event of excessive AC input current to the charger 126 (including primary or secondary windings), short circuit, or failure of the load module 122.

The power switch 108 is an electrical switch for electrically activating the charger tester 100. The power switch 108 provides a manual switch for activating or deactivating the charger tester 100. The power indicator 112 may be utilized to indicate that the charger tester 100 is performing testing of the charger 126. Alternatively, the power indicator 112 may also indicate when the charger tester 100 is plugged in through the AC power inlet 120 and/or when the power switch 108 has been activated. For example, the power switch 108 may power on the AC test outlet 102 in response to receiving the adapter module 124 in the adapter port 104 or in response to receiving either end of the charger 126.

As shown, the charger tester 100 may be encompassed by plates, panels, or one or more frames that house the circuits, ports, indicators, and other elements of the charger tester. The charger tester 100 may take any number of shapes and configurations. In another embodiment, the charger tester 100 may include a display that indicates the current, voltage, load, and internal temperatures of the charger. In response to some of the tests, the test conditions may vary and the displays of the charger tester 100 may display the applied parameters as well as the measured parameters.

Figure 2:
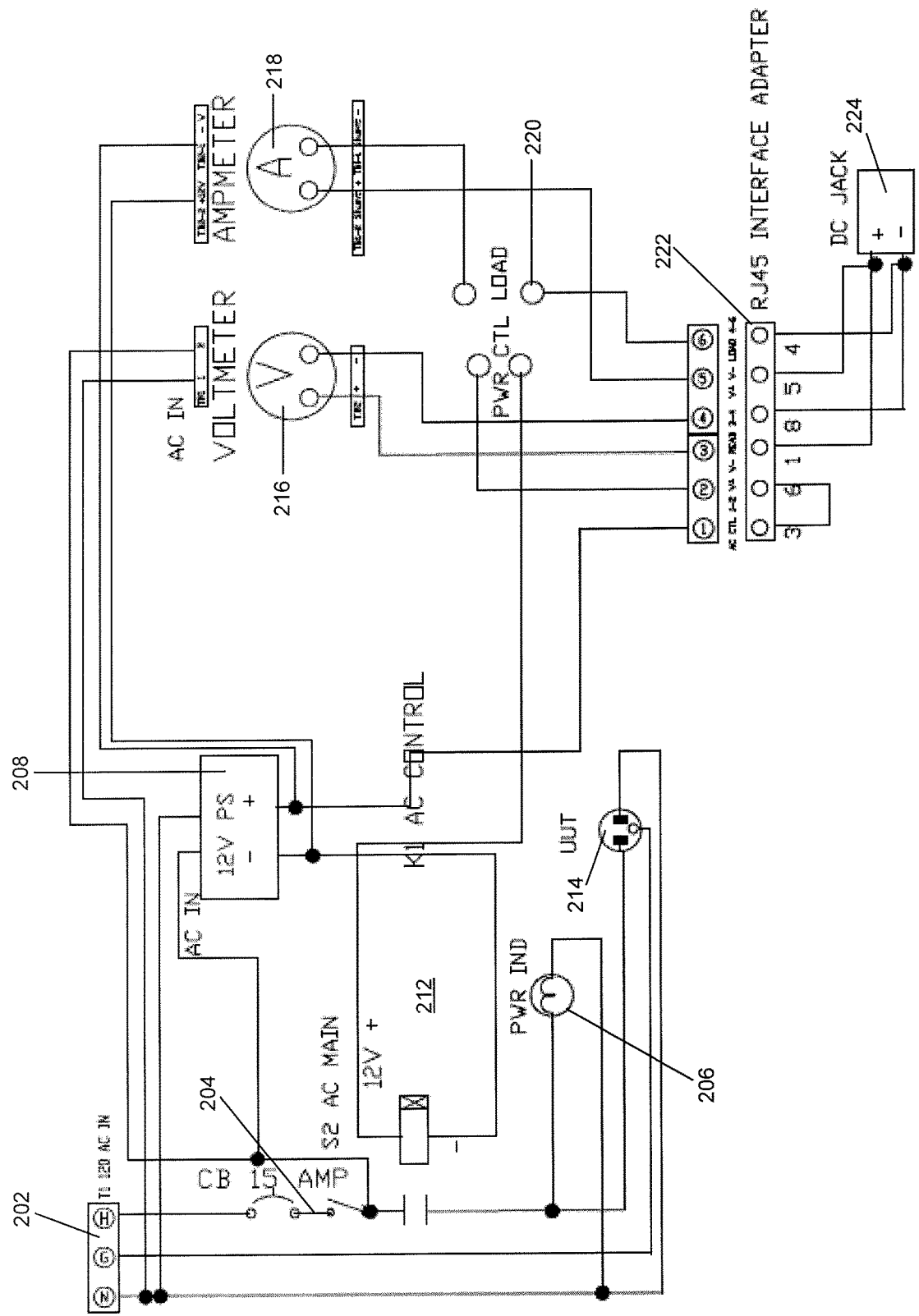
FIG. 2 is a circuit schematic representation of the charger tester in accordance with an illustrative embodiment.

Referring now to FIG. 2, a circuit schematic representation of the charger tester is illustrated. FIG. 2 provides one embodiment of a charger tester circuit 200 that may be part of a charger tester, such as charger tester 100 of FIG. 1. In one embodiment, the charger tester circuit 200 may include an AC power inlet 202, a circuit breaker 204, a power indicator 206, a power supply 208, a control relay 212, an AC power outlet 214, a voltmeter 216, an ammeter 218, a load port 220, an adapter port 222, and a DC jack 224.

The charger tester circuit 200 may utilized any number of configurations and is one implementation of a portion of the components of the charger tester 100 of FIG. 1. For example, the charger tester circuit 200 may include any number of amplifiers, filters, transformers, ports, adapters, boards, memories, processors, chips, programmable logic, and other similar components that, although not explicitly shown, may further enable the processes and functionality of the charger tester circuit 200 as herein described.

The AC power inlet 202 is an interface for receiving alternating current. The AC power inlet 202 may interface with a power cord, transformer, power interface, or plug for powering the charger tester circuit 200. The power supply 208 converts the alternating current into a voltage usable by the charger tester circuit 200 to power the internal components and power a charger during testing. As previously disclosed, the power supply 208 may include an interface for regulating the voltage standard applied to the charger.

The circuit breaker 204 is an automatically-operated electrical switch designed to protect the charger tester circuit 200 from damage caused by overload, short circuit, or overheating. For example, in response to a short in a charger, adapter module, or load module that begins to overload the charger tester circuit 200, the circuit breaker 204 may disable power to the charger through the AC power outlet 214 by disconnecting power through all or a portion of the charger tester circuit 200.

In one embodiment, the AC power outlet 214 may be a standard 120 V outlet. Alternatively, the AC power outlet 214 may include power outlets or interfaces for other world standards, vehicle chargers, USB chargers, and the power end of alternative types of chargers.

The control relay 212 is also an electrically operated switch that acts as a safety device. In one embodiment, the control relay 212 may activate power between the AC power outlet 214 and the DC jack 224 in response to the adapter module being inserted in the DC jack 224. As a result, the charger tester circuit 200 is self-energized based on insertion of the adapter module in the DC jack 224 and similarly powered down in response to removal of the adapter module.

The power indicator 206 may indicate that power is being supplied to the charger tester circuit 200 or to the AC power outlet 214. For instance, the power indicator 206 may light up when alternating current is received through the AC power inlet 202. The power indicator 206 may also light up when the AC power outlet 214 is actively supplying a voltage to a charger under test.

The load port 220 provides an interface for receiving the selected load module. The load port 220 may also provide a safety feature by acting as an AC power relay control in conjunction with the adapter port 222. For example, the load port 220 may include ports configured to receive banana plugs. Alternative types of connectors, terminals, and plugs may also be utilized for both the load port 220 and the load module. The load port 220 provides an interface for applying the resistive load across the charger tester circuit 200 in order to measure voltage, amps, and other performance characteristics of the charger. As previously described, the volt meter 216 and the ammeter 218 may measure voltage and current, respectively. In another embodiment, the load port 316 and load module 322 may be replaced by an internal programmable load. The load may be set utilizing a dial, touch screen, keypad, or external interface. For example, the charger tester 300 may include a communications interface, such as a USB port or Ethernet connection for updating a test application or logic of the charger tester.

The adapter port 222 provides one example of pins and wiring utilized to test the charger. In one embodiment, the adapter port 222 is configured to interact with the DC jack 224, such as an RJ-45 jack. The DC jack 224 may utilize spring loaded electrical connections to interface with the adapter module, such as an RJ-45 head.

In other embodiments, the charger tester circuit 200 may have more complex configurations for receiving user input through a user interface, such as a touch screen, voice commands, or other elements to dynamically configure the charger tester for testing a specified charger type. For instance, based on information from a user, the charger tester circuit 200 may locally retrieve or look up charger information through a network connection or database stored in memory to select the appropriate configuration and applicable load utilized to test the charger.

Figure 3A:
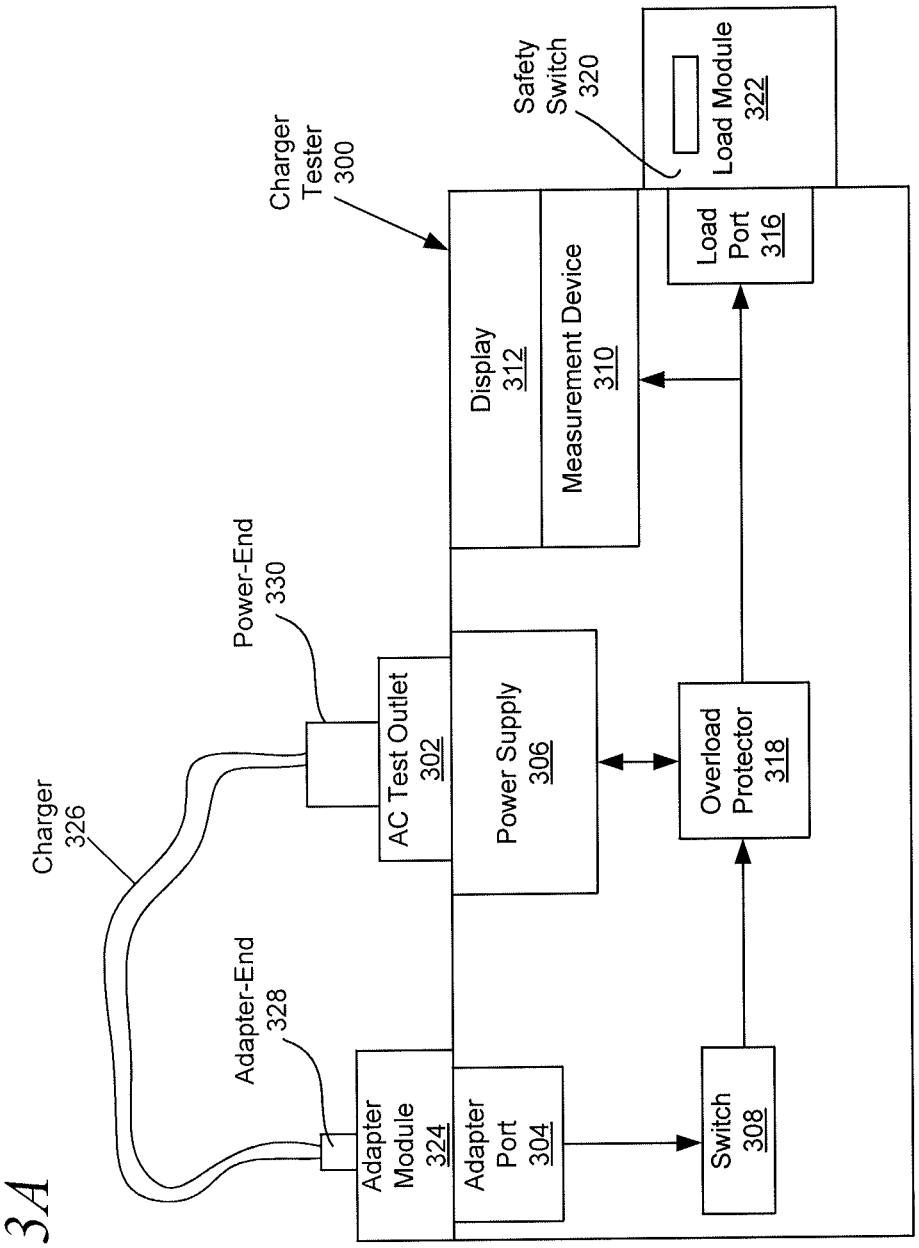
FIG. 3A is a pictorial representation of a charger tester in accordance with an illustrative embodiment.
Figure 3B:
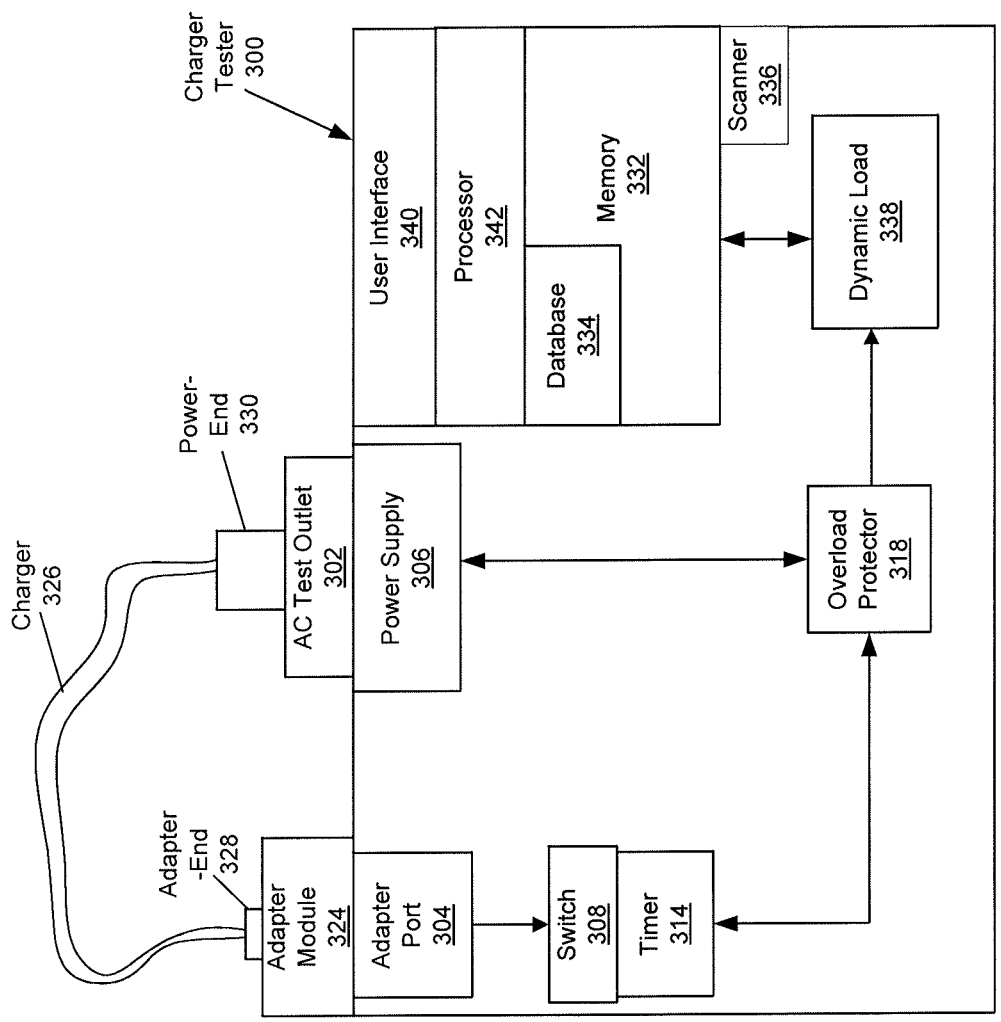
FIG. 3B is a pictorial representation of an alternative charger tester in accordance with an illustrative embodiment.

Referring now to FIGS. 3A-B that provide alternative embodiments of a charger tester 300. The charger tester 300 of FIG. 3A may include an AC test outlet 302, an adapter port 304, a power supply 306, a switch 308, a measurement device 310, a display 312, a load port 316, an overload protector 318, a safety switch 320, a load module 322 and an adapter module 324. As previously described, the load module 322 and the adapter module 324 may be modularly connected or configured to test a charger 326 with an adapter-end 328 and a power-end 330. The configuration of the charger tester 300 in FIG. 3A generally corresponds to the embodiments of FIG. 1A, FIG. 1B and FIG. 2. All or portions of the charger tester circuit 200 of FIG. 2 may be implemented in the charger tester 300 of FIGS. 3A and 3B.

The modular design for the load module 322 and adapter module 324 allows loads and adapters for chargers to be easily replaced in the event of failure and changed out for testing different chargers without having charger specific testers.

As previously disclosed, the measurement device 310 may include the volt meter and ammeter that indicate the voltage and amperage drawn by the charger 326 during testing. The measurement device 310 may alternatively include other measurement circuits or modular testing elements configured for testing the charger 326, such as an ohm meter, tone sensor, fault detector, and other elements.

In another embodiment, the measurement device 310 may include indicators, such as light emitting diodes (LED)s, LED screen(s), or a textual display that indicates whether the charger 326 has passed the test executed by the charger tester 300. In some embodiments, LEDs indicating a test pass, test fail, or testing error may include for each charger being tested. The measurement device 310 may function in conjunction with the display 312 to audibly, visually, or otherwise indicate information and data to a user utilizing the charger tester 300. The measurement device 310 may include digital or analog thresholds or criteria indicating whether the charger 326 has passed a test. The measurement device 310 may utilize logic to indicate compliance or non-compliance of the charger 326 with the criteria.

The load module 322 may also include a safety switch 320. The safety switch 320 is a switch that prevents the resistive elements of the load module 322 from overheating or otherwise being damaged during the testing process. For example, the charger tester 300 may be utilized to perform numerous tests of chargers over an extended amount of time. During that time period, the load module 322 may heat substantially. As a result, the safety switch 320 provides an additional protection for the load module 322 that similarly protects the charger tester 300 beyond the protections provided by the switch 308 and the overload protector 318 as previously described. In one embodiment, the overload protector 318 includes a heat sink and fan or blower for dissipating the heat of the charger tester 300. As a result, the heat generated from testing one or multiple chargers simultaneously is dissipated. For example, the charger tester 300 may be configured to supply up to 3 A through each charger simultaneously requiring that significant heat from the power supply 306 be expelled to keep the charger tester operational. Dissipating heat may be particularly important for tests that require 1-10 minutes a piece. The charger tester 300 is configured to dissipate heat indefinitely during utilization with the heat sink and a blower cooling the components of the charger tester 300.

Turning now to FIG. 3B, the various embodiments of the charger tester 300 as herein disclosed may include components, elements and other configurations that may be combined selectively to provide specified features and technical configurations for testing purposes. In addition to those elements previously described, the charger tester 300 of FIG. 3B may further include a user interface 340, a processor 342, a memory 332, a database 334, a scanner 336, a timer 314 and a dynamic load 338.

The timer 314 may be utilized to ensure that the charger 326 is only tested or energized under test for a specified amount of time. In one embodiment, the timer 314 is a bi-metallic switch that is configured to test the charger tester 300 for approximately two to five seconds before disengaging the circuit powering the charger 326. The bi-metallic switch may prevent the charger tester 300 from overheating. The bi-metallic switch may be disengaged based on the time or current that it takes for a bi-metallic strip within the switch to be mechanically displaced thereby tripping the bi-metallic switch and severing the testing circuit. For example, the bi-metallic switch may disconnect the testing circuit after a current and/or time has heated the components of the bi-metallic switch to one or more threshold levels. In one embodiment, the bi-metallic switch may be integrated with the load module or dynamic load 338. The bi-metallic switch may disconnect the DC side of the charger for disconnecting the output of the charger as well as the power pins of the adapter module 324, such as pins 3 and 6 of an RJ45 jack.

In another embodiment, the timer 314 may be a digital or analog timer that performs the test for a specified amount of time once the adapter module 324 is inserted into the adapter port 304. For example, the timer 314 may be configured by a user to engage the circuit between the AC test outlet 302 and the adapter module 324 for three seconds to implement the test. However, the test may run for seconds or minutes based on the applicable testing requirements required by the charger type, service provider, OEM, or testing party. After three seconds, the timer 314 disconnects the circuit or voltage applied through the AC test outlet 302 to the power-end 330 of the charger 326 until the adapter module 324 is removed and then reinserted with the same charger 326 or another charger being tested. Alternatively, the charger tester 300 may incorporate any number of other timing elements that may ensure that the testing of the charger does not exceed a specified time period or to distinctly set a time period for testing the charger 326.

In one embodiment, the charger tester 300 is an interactive device capable of interacting with the user and similarly retrieving internally or externally stored information. For example, the charger tester 300 may include a wireless transceiver, network adapter, or other similar cards, ports, interfaces, boards, or components for communicating with one or more devices or wired or wireless networks for sending and receiving data required by the charger tester 300 or information received from a user. For example, as a number of tests are performed for specific chargers, an identifier, such as a part number or other label, may be associated with each charger and the results of the test for the charger may be stored in an externally located database that may be updated based on tests performed utilizing the charger tester 300. As a result, test results may be automatically or selectively communicated to one or more external devices, memories, or databases for access or storage. In another embodiment, the timer 314 may utilize a significantly increased amount of time. For example, the timer 314 may power the charger 326 for long enough to thoroughly test the charger 326 once heated by resistance. In addition, the charger tester 100 may run multiple tests on the charger 326 including varying the applied voltages, currents, and load.

In one embodiment, the user interface 340 may include one or more interfacing elements for receiving user input and information. The user interface 340 may include a touch screen, keypad, keyboard, scroll wheel, buttons, switches, mouse, or other internally or externally integrated peripherals. The user interface 340 may be utilized to receive information regarding the charger 326 or the associated electronic device. For example, the user may access the user interface 340 to specify a brand of cell phone or electronic device that is charged or powered by the charger 326. Based on the user providing this information through the user interface 340, the charger tester 300 may utilize the memory 332, database 334, or other configurable logic in the charger tester 300, to configure the dynamic load 338. For example, based on a selection of a Motorola phone associated with the charger 326, the dynamic load 338 may be configured to specific load values to best simulate actual operation of the charger 326 in a real world environment. The database 334 may be updated automatically or manually. For example, OEM or service provider servers or database may be accessed to determine the testing parameters, acceptable threshold and tolerance levels, and testing scripts or procedures that may be required for testing associated chargers. The database 334 may be updated automatically or in response to the user uploading updates or prompting the charger tester 300 to find updates.

The processor 342 is circuitry or logic enabled to control execution of a set of instructions. The processor 342 may be microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks. The processor 342 may be a single chip or integrated with other computing or communications elements.

The memory 332 is a hardware element, device, or recording media configured to store data for subsequent retrieval or access at a later time. The memory 332 may be static or dynamic memory. The memory 332 may include a hard disk, random access memory, cache, removable media drive, mass storage, or configuration suitable as storage for data, instructions, and information. In one embodiment, the memory 332 and processor 342 may be integrated. The memory may use any type of volatile or non-volatile storage techniques and mediums.

The memory 332 and/or database 334 may store data, information, specifications, or configurations for a number of chargers and associated electronic devices. For example, the database 334 may store configurations of the dynamic load 338 for a number of different phone models, device types, adapters, versions, and so forth. As a result, the user interface 340 may more accurately indicate to the user whether the charger 326 has passed one or more tests based on criteria, parameters, thresholds, percentages and requirements for the charger as stored in the database 334. The memory 332 and database 334 may be updated through a network connection as previously described. Additionally, the user interface 340 may include other interfaces, such as a USB port for updating the database 334 through a thumb drive or other externally connected device or storage element. The memory 332 may store testing scripts that run one or more tests on the charger 326 simultaneously or in series. The testing scripts may be executed by the processor 342 to test the functionality and performance characteristics of the charger 326.

In one embodiment, the memory 332 may store load values associated with each adapter module 324, such that when the adapter module 324 is connected to the charger tester 300 the load values are automatically applied by the charger tester.

In one embodiment, the memory 332 or database 334 may store a table. The table may be utilized to look up data or information for configuring the dynamic load. For example, based on user input received through the user interface 340 or information automatically determined by the charger tester 300, the table may configure the dynamic load 338. The table may also be utilized to determine functionality or non-functionality of the charger 326 based on the performance characteristics measured during testing of the charger 326. For example, based on threshold values for voltage, current, and resistance, the table may display a pass or fail indicator through the user interface 340. The table may store a number of threshold values for passing, failing, or generating a diagnostic for each charger.

In one embodiment, different OEMs or service providers may have specific test configurations, scripts, specifications, tolerances, or parameters that are required for chargers utilized or associated with their company, products, or network. In another embodiment, the charger tester 300 may include the scanner 336. The scanner 336 may automatically determine the charge testing parameters and information associated with the charger 326.

In one embodiment the scanner 336 is a barcode scanner that scans a barcode, numbers, engravings, or other markings engraved on or attached to the charger 326 by a sticker, label, or other indicator. The scanner 336 may communicate with the processor 342 and memory 332 to retrieve the relevant charge testing information. As a result, based on one or more scans, any number of devices may be tested utilizing a single parameter or test script. Similarly, the scanner 336 may note specific information for each charger 326, such as an item identification number to store the results of the test to further distribute, recycle, scrap, or otherwise process one or more chargers based on the results of successful or unsuccessful tests. Most chargers include an attached or engraved label, identification, or bard code. In one embodiment, the scanner 336 is an optical imager that utilizes optical character recognition to determine the applicable voltage, amperage, manufacturer, and applicable load. The scanner 336 may utilize a light, flash, or different imaging processes to distinguish the writing of the label especially where the background color and the writing are the same color (e.g. black background of the charger has black writing or white writing on a white background.

In another embodiment, the scanner 336 may be a radio frequency identification (RFID) tag reader. The RFID tag reader may identify or retrieve information from an RFID tag integrated with the charger 326 or associated with the corresponding mobile device. The charger tester 300 may similarly configure the dynamic load 338 based on the RFID tag or the barcode to quickly and efficiently implement testing.

Loads may be applied by the dynamic load utilizing electronic switching having specific data read from the OEM stored file by scanning the charger or associated electronic device or determining the IMEI of the phone with which the charger is associated. The dynamic load 338 may represent a physical resistive array and may be configured based on the load requirements of the charger. For example, OEM Motorola requires 5 ohms at 10 watts; this configuration may be created by selecting the actual single resistor or a combination of resistors (in series or parallel) which equates to the needed load. Another charger tester 300 or method may utilize a similar resistive array that is manually selected by a user though a series of switches for the specific charger under test.

In yet another embodiment, the charger tester 300 may be utilized to interface with batteries or other energy storage devices. The condition and status of the battery may be tested utilizing the charger tester 300 and one or more interfaces adapted to connect the battery to the charger tester 300. The charger tester 300 may include sense lines for feedback and thermal sensing. The charger tester 300 may be utilized to test individual cells or arrays of cells within the battery to determine functionality and capabilities of the batteries under test. The battery testing function of the charger tester 300 may allow use of common circuitry and functions including AC and DC power elements. The charger tester 300 may also enable data transfer of battery status for record keeping and may include multiple interfaces allowing for simultaneous testing of different battery types. After charging is complete the variable load array may be selected to implement battery testing, allowing the charger tester 300 to select an electronically proper load. Test results may be saved, archived, or accessed as needed. The modular elements of the charger tester 300 provide an integrated approach that requires less redundant circuitry than a separate standalone unit for testing chargers or batteries. In the event of failure of one or more elements of the charger tester 300, replacing modular or otherwise fixing the charger tester 300 is quick and cost effective.

In one embodiment, the charger tester 300 may be configured to test multiple chargers sequentially or simultaneously. As a result, the charger tester may include multiple ports for receiving the relevant adapter modules and load modules. The other components of the charger tester 300 may be similarly configured.

In another embodiment, the processor 342 may execute a script to scan the charger 326. The scan may provide characteristics of the charger 326. The results of the scan may be compared to other scan results to determine the type and configuration of the charger 326 in order to configure the dynamic load 338 and the tests run by the charger tester 300.

Referring now to FIGS. 4A-B, FIG. 4A illustrates a front-view of adapter modules 402, 404, 406, and 408. FIG. 4B illustrates a top-view of the adapter module 402 which is similarly representative of other adapter modules. The adapter modules 402, 404, 406, and 408 include ports 410, 412, 414, and 416, and connector 418.

The adapter modules 402, 404, 406, and 408 represent a few of many possible adapter modules that may be utilized with the charger tester to test or evaluate different types of chargers. As is well known, many of the chargers may utilize DC connectors or adapter-ends with specific voltages, polarity, current rating, power supply filtering and stability, and mechanical configurations that are incompatible with other chargers and mobile devices. The ports 410, 412, 414, and 416 are configured to receive specific types of adapter-ends of the chargers. For example, the ports 410, 412, 414, and 416 may be configured to receive mini or micro-USB connectors and numerous other types of adapter-ends of the chargers associated with handset manufacturers, services providers, and standards.

The pins, traces, or electrical connection elements of the ports 410, 412, 414, and 416 are connected to the connector 418. The connector 418 is a uniform adapter that allows the adapter modules 402, 404, 406, and 408 to be connected to the charger tester through a single port or jack, such as, for example, through the adapter port 222 of FIG. 2. The pins, leads, or connectors of the ports 410, 412, 414, and 416 and connector 418 allow the charger to be tested as if it were connected to an actual electronic device for charging or operation.

In one embodiment, the charger tester may supply power through the charger in response to a user inserting the connector 418 into a corresponding port of the charger tester. In one embodiment, the connector 418 represents an RJ45 head or connector. The connector 418 may be an RJ45 head based on know data regarding reliability and durability over time. RJ45 heads are also easily identifiable, oriented, and inserted or removed from the charger tester. In one embodiment, the connector 418 may not include a locking tab that locks once inserted in a corresponding jack or port. Alternatively, the connector 418 may be any number of other male-connector types including USB or other similar connector types.

FIG. 5A illustrates a front-view of load modules 502, 504, 506, and 508. FIG. 5B illustrates a side view of the load module 502. With regard to FIGS. 5A-B, the load modules 502, 504, 506, and 508 are resistive loads that simulate the load placed on a charger during the charging process. The load modules 502, 504, 506, and 508 may include two or more connectors 510 and 512. The connectors 510 and 512 electrically connect the resistive load of the load modules 502 to the charger to complete the testing circuit. For example, the connectors 510 and 512 may be connected across the load port 220 of FIG. 2 to apply a load across the corresponding portions, pins, or conductors of the charger. The connectors 510 and 512 may be banana connectors or other similar connectors or terminals.

In one embodiment, the load modules 502, 504, 506, and 508 (and the adapter modules 402, 404, 406, and 408 of FIG. 4) may be labeled, engraved, or color coded to indicate a charger or mobile device type associated with the load module and the orientation of the load modules 502, 504, 506, and 508 for connection to the charger tester. This information may be automatically or manually scanned or read by the charger tester. In one embodiment, the charger tester includes a single load port configured to receive the two or more connectors of the load modules 502, 504, and 506. However, the charger tester may alternatively include additional ports or the ports may be configured to receive alternative types of connectors as shown by load module 508. In one embodiment, multiple load modules may be utilized to reach a specified resistive load.

The adapter modules 402, 404, 406, and 408 of FIG. 4 and the load modules 502, 504, 506, and 508 of FIG. 5 may be replaced or changed out in response to failure due to repeated use or other problems. As a result, the charger tester may be reconfigured and continue to remain operational despite failures of the modular components. The switches and ports, such as the adapter port and load port, of the charger tester may also be modularly integrated with the charger tester in order to replace or exchange portions of the charger tester as needed. In another embodiment, the adapter modules 402, 404, 406, and 408 of FIG. 4 and the load modules 502, 504, 506, and 508 of FIG. 5 may be integrated with the charger tester so that only the adapter-end or power-end of the charger is inserted into the charger tester.

Figure 6:
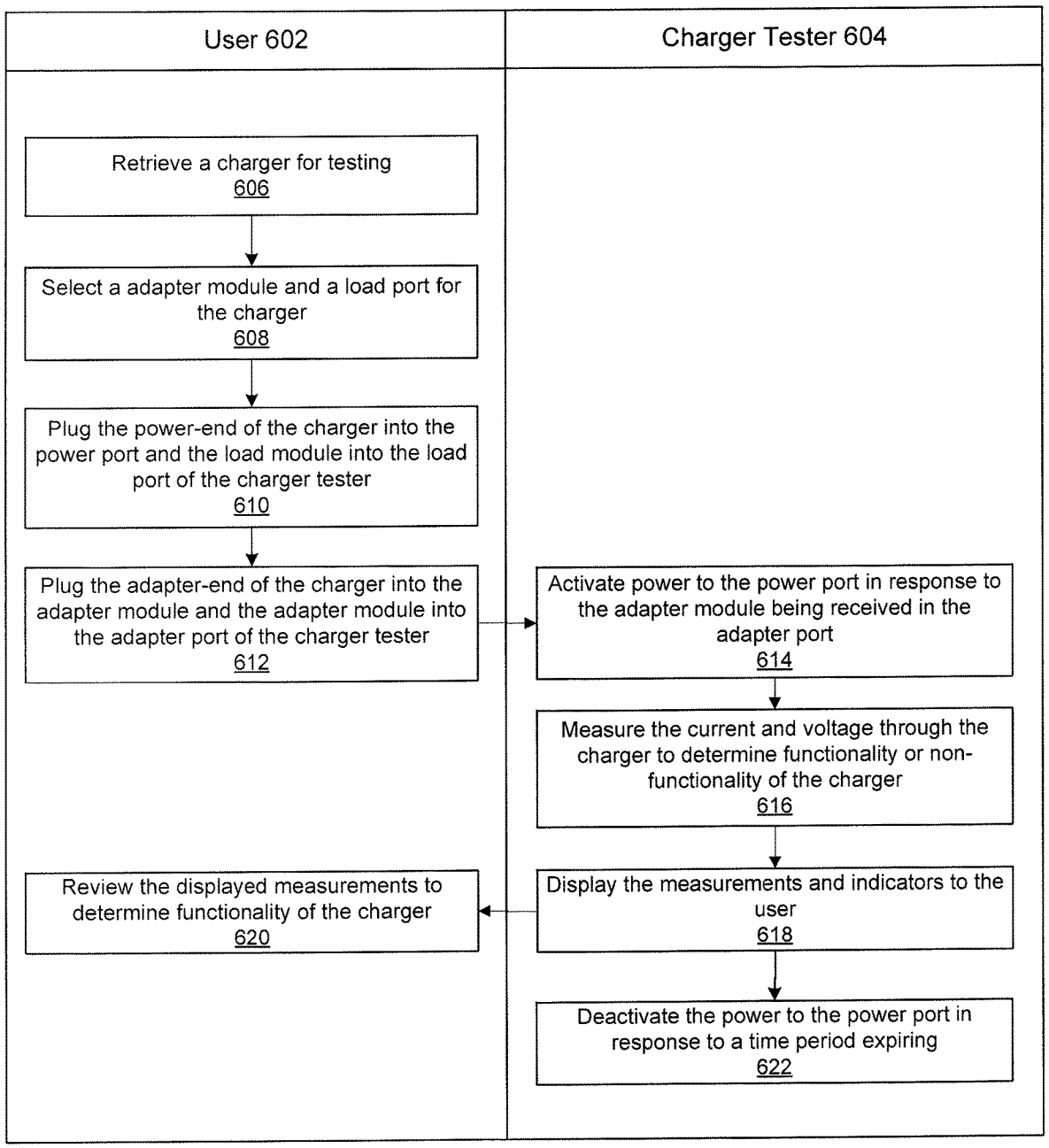
FIG. 6 is a flowchart of a process for testing a charger in accordance with an illustrative embodiment.

FIG. 6 is a flowchart of a process for testing a charger in accordance with an illustrative embodiment. The process of FIG. 6 may be implemented by a user 602 and a charger tester 604 in accordance with one embodiment. The order of the steps in FIGS. 6 and 7 may be varied based on environment, conditions, and user preferences.

The process may begin with the user 602 retrieving a charger for testing (step 606). The charger may be tested as part of a returns, replacement, refurbishment, or repair process or other procedure that may require verification of the functionality of the charger.

Next, the user 602 selects an adapter module and a load module for the charger (step 608). The adapter module and the load module represent adapters or modules for testing the specific model or type of charger. The adapter module and the load module may include labels, markings or other indicators associating each with one or more makes, models, or types of mobile devices for identification by a user or automated element, such as a scanner.

Next, the user 602 plugs the power-end of the charger into the power port and the load module into the load port of the charger tester (step 610). In other embodiments, the charger tester may be utilized to test chargers for vehicles, battery packs, or other similar electronic elements.

Next, the user 602 plugs the adapter-end of the charger into the adapter module and the adapter module into the adapter port of the charger tester (step 612).

Next, the charger tester 604 automatically activates power to the power port in response to the adapter module being received in the adapter port (step 614). As previously described, both the load module and the adapter module must be electrically connected to the charger tester in order for the charger to be energized.

Next, the charger tester 604 measures the current and voltage through the charger to determine functionality or non-functionality of the charger (step 616).

Next, the charger tester 604 displays the measurements and indicators to the user (step 618). The measurements and indicators may be displayed in alphanumeric format or utilizing visual indicators, such as a screen, green or red LEDs, or other displays to indicate that the charger has passed or failed according to specified parameters stored by the charger or utilized by the user 602.

Simultaneously, the user 602 reviews the displayed measurements to determine functionality of the charger (step 620). The display may also flash red or green or words, such as "Pass" or "Fail." Where multiple chargers are being tested simultaneously, the charger tester 604 may include pass or fail LEDs for each charger.

The charger tester 604 may also deactivate the power to the power port in response to a time period expiring (step 622). The power may be deactivated utilizing a timer, a bi-metallic switch, or other timing element.

Figure 7:
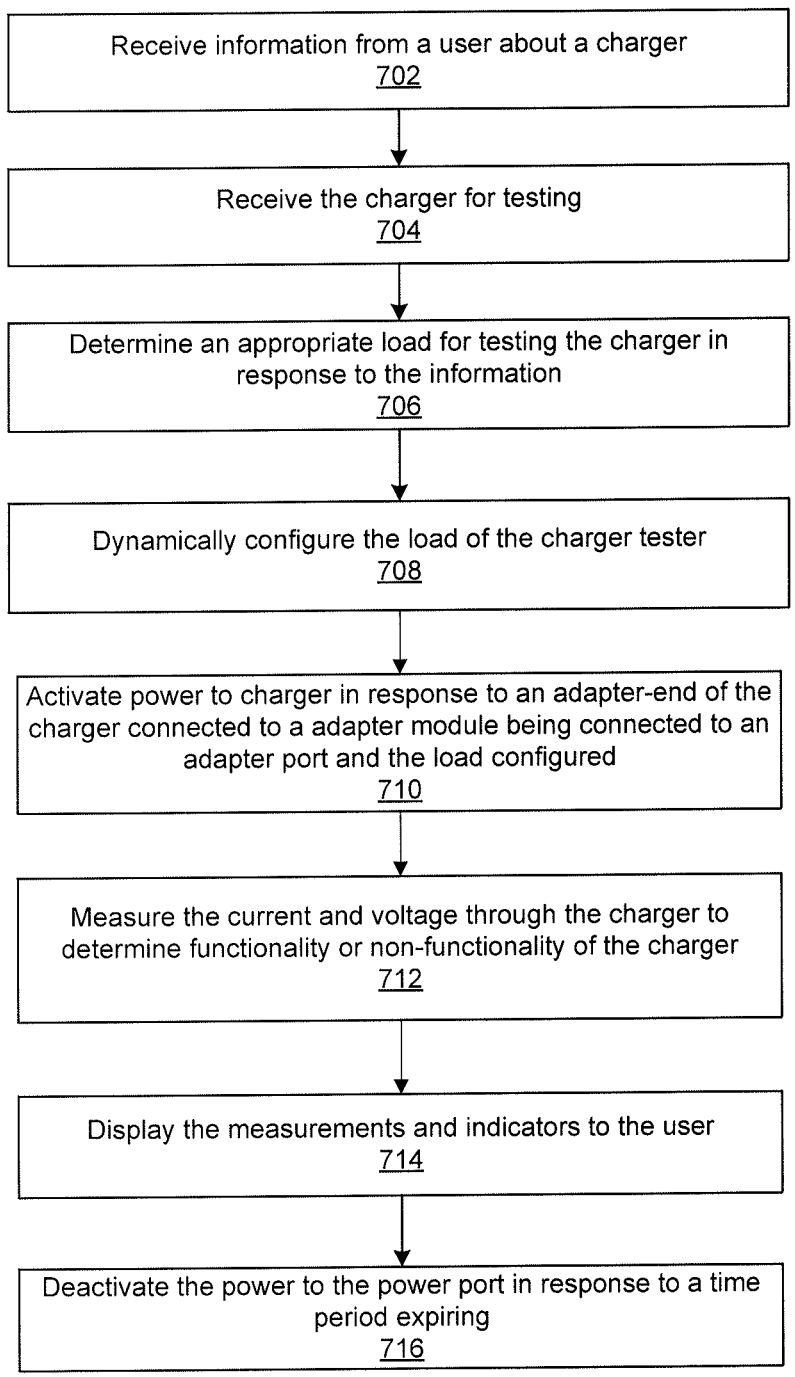
FIG. 7 is a flowchart of another process for testing a charger in accordance with an illustrative embodiment.

FIG. 7 is a flowchart of another process for testing a charger in accordance with an illustrative embodiment. The process of FIG. 7 may be implemented by a charger tester based on interaction with a user to test a charger. The process may begin by receiving information from a user about a charger (step 702). The information may include functional parameters for the charger and the associated mobile device. For example, the information may specify a make, model, operating system version, or other information associated with the charger. In one embodiment, the charger tester may include a scanner, such as a barcode scanner that scans a barcode or other identification information on the charger.

Next, the charger tester receives the charger for testing (step 704). For example, the power-end of the charger may be connected to the charger.

Next, the charger tester determines an appropriate load for testing the charger in response to the information (step 706). For example, particular brands of charger testers may require a specified resistive load to simulate the load required to charge the mobile device. The load may also be varied during testing to ensure functionality at minimum to maximum load parameters.

Next, the charger tester dynamically configures the load of the charger tester (step 708). The charger tester may also set fixed or variable testing parameters and how the test results are recorded.

Next, the charger tester activates power to the charger in response to an adapter-end of the charger connected to an adapter module being connected to an adapter port and a load configured (step 710). The charger tester may power the charger in response to determining or sensing that the adapter module has been inserted in the test port. In another embodiment, insertion of the adapter module automatically completes the testing circuit to initiate testing.

The charger tester measures the current and voltage through the charger to determine functionality or non-functionality of the charger (step 712). The determination may be made based on testing or measurements scripts or programs executed by the charger tester.

Next, the charger tester displays the measurements and indicators to the user (step 714). The measurements and indicators may also be stored and/or communicated to an external device.

The charger tester deactivates the power to the power port in response to a time period expiring (step 716). The time period may be determined electronically or mechanically. For example, a digital or analog timer or bi-metallic switch may be utilized. The timer may disconnect power to the charger after a period of two to five seconds as set by testing parameters or a user. The bi-metallic switch may disconnect power to the charger in response to a temperature of the bi-metallic switch reaching a certain point or overheating due to current passing through the bi-metallic switch. The process of FIG. 7 may be similar to the process of FIG. 6.

Figure 8:
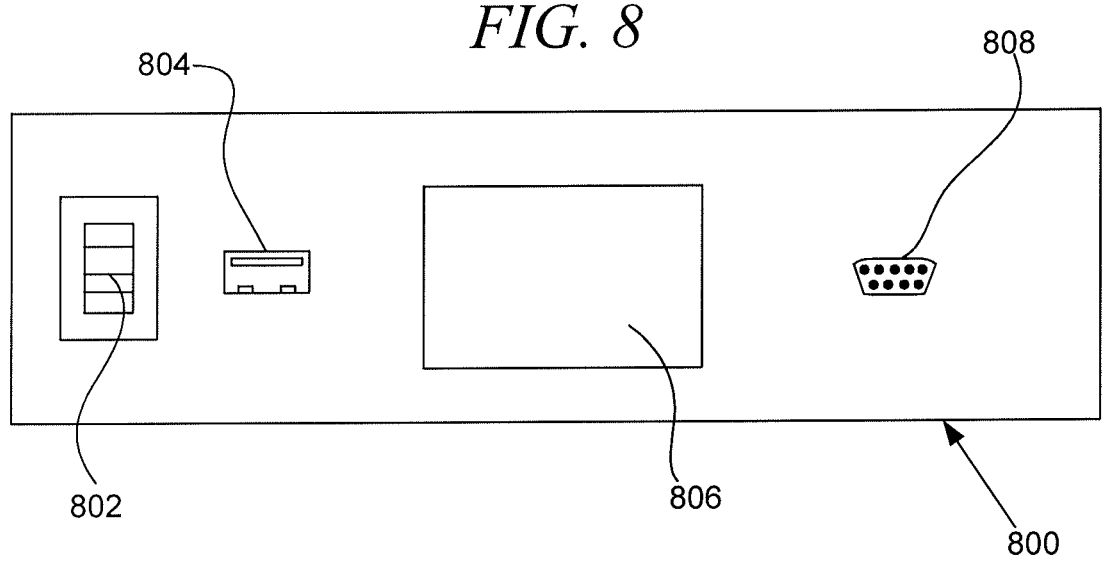
FIG. 8 is a front view of a power supply tester in accordance with an illustrative embodiment.

FIG. 8 is a front view of a power supply tester 800 in accordance with an illustrative embodiment. The power supply tester 800 is another embodiment of the charger testers that are herein described. The power supply tester 800 may be configured for testing one power supply at time or may be configured to include additional components for testing multiple power supplies simultaneously. In one embodiment, the power supply tester 800 may include a power switch 802, a USB connector 804, a display 806, and a connector 808.

The power switch 802 is utilized to turn on and off the power supply tester 800 for testing power supplies. For example, the power supply tester 800, may include a separate AC connection for powering the components of the power supply tester 800. For example, the power switch 802 may be a push-button or toggle switch.

The USB connector 804 is a connection utilized to receive programming information and data. The programming information and data may be utilized to store a program or instructions for testing each type or category of power supply. For example, the USB connector 804 may be connected to a memory that is updated with new programming in response to the power supply tester 800 being updated by another computing or communications device. The power supply tester 800 may be updatable to receive a new operating system, kernel, or applications that function independently or together to perform the power supply testing. In another embodiment, the power supply tester 800 may include an FPGA that is updated to perform the testing in response to new programming or instructions. The programming may indicate the voltage, current, and load applied to each power supply based on type, configuration, test and so forth. For example, the programming and configuration of the power supply tester may correspond to an identifier, such as a module connected to the connector 808, such as a DAC or EEPROM module. The identifier may be read by the power supply tester 800 from the connector 808 and the identifier may be associated with the information, data or parameters utilized to perform the testing of the power supplies by the programming.

The display 806 is a display that verifies the current settings and programming being utilized by the power supply tester 800. For example, the display 806 may indicate the current and voltage being applied by the power supply tester 802 a power supply and corresponding limits or thresholds of both the power supply tester 800 and acceptable output results from the power supply.

The connector 808 is configured to receive a load module. In one embodiment, the load module includes a DAC or EEPROM that is read by the power supply tester 800 to indicate a resistive load, voltage, current, and thresholds for each to be applied to the power supply. The load module may also indicate the expected output results of the power supply. As a result, the display 806 may display both the applied or input current, voltage, and resistive load, as well as the expected output of the power supply including ranges, parameters, or thresholds. In another example, the load module may include an actual resistive load.

Figure 9:
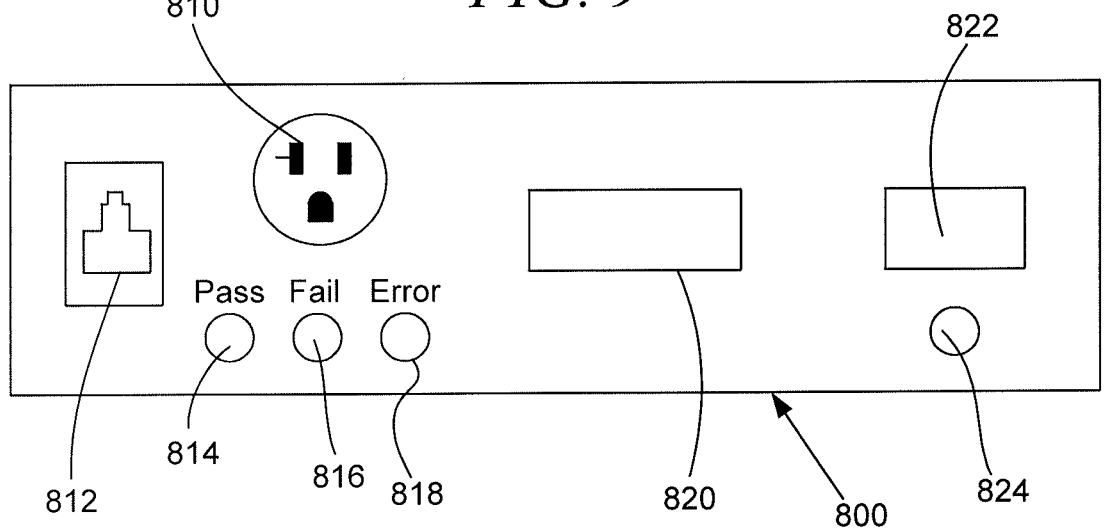
FIG. 9 is a top view of a power supply tester in accordance with an illustrative embodiment.

FIG. 9 is a top view of the power supply tester 800 of FIG. 8 in accordance with an illustrative embodiment. The power supply tester 800 may include a DC output connector 810, an AC connector 812, LEDs 814, 816, and 818, a voltage display 820, a current display 822, and AC power indicator 824.

The DC output connector 810 is configured to receive an adapter module. In one embodiment, the DC output connector 810 is an RJ-45 port configured to receive an adapter module with an RJ-45 head. In another embodiment, the DC output connector 810 may be configured to receive the DC end of the power supply directly. The DC output connector 810 may also include a number of ports for different plug types.

The AC connector 810 is utilized to energize and power the power supply. The LEDs 814, 816, and 818 may indicate whether the power supply passed, failed, or if there was an error with the power supply tester 800, respectively. The AC connector 810 may also display text based information or results on any of the displays of the power supply tester 800.

The voltage display 820 may be display the voltage output from the power supply and may communicate with a voltmeter of the power supply tester 800. The current display 822 may display the current output from the power supply and may communicate with an ammeter of the power supply tester 800. The AC power indicator 824 may indicate whether AC power is being provided to the one or more power supplies under test. The AC power indicator 824 may also indicate whether the power supply tester 800 is turned on.

The previous detailed description is of a small number of embodiments for implementing the invention and is not intended to be limiting in scope. The following claims set forth a number of the embodiments of the invention disclosed with greater particularity.

What is claimed:

1. A method for testing a charger, the method comprising:
   receiving a charger at a charger tester, wherein the charger tester is configurable to test a plurality of charger types utilizing test parameters associated with each of the plurality of charger types, wherein the test parameters include a load that is dynamically configured for application to a charger type of the charger;
   testing the charger utilizing the test parameters;

measuring performance characteristics of the charger during testing; and indicating a result of the testing.

2. The method according to claim 1, wherein receiving the charger at the charger tester comprises:

receiving a power-end of the charger in a power port of the charger tester; and receiving an adapter end of the charger in an adapter port of the charger tester.

3. The method according to claim 2, further comprising activating the charger tester to power the charger in response to the power-end of the charger and the adapter end of the charger connecting to the charger tester.

4. The method according to claim 2, wherein the power-end of the charger is an ungrounded plug with two flat parallel prongs.

5. The method according to claim 2, wherein the power-end of the charger is a grounded plug with two flat parallel prongs and one round pin that is longer than the two flat parallel prongs.

6. The method according to claim 1, comprising receiving information from a user interface of the charger tester associated with the charger type of the charger to set the test parameters that are associated with the charger type.

7. The method according to claim 6, wherein the user interface includes a scanner for reading a label or an identifier associated with the charger.

8. The method according to claim 1, wherein the performance characteristics are stored in a database and associated with an identifier for each of the plurality of charger types.

9. The method according to claim 1, wherein an adapter end of the charger is connected to an adapter module that connects to the tester.

10. The method according to claim 1, wherein an AC signal provided to the charger is varied according to the test parameters.

11. The method according to claim 1, wherein indicating the result of the testing comprises:

activating one or more LEDs to indicate whether the charger passed the testing.

12. The method according to claim 1, further comprising:

deactivating power to the charger in response to a safety threshold being exceeded.

13. The method of claim 1, wherein the charger tester comprises:

an adaptor port operable to receive an adapter of the charger;

a power port operable to receive a power-end of the charger, wherein the power port provides an alternating current (AC) signal to the charger;

a power supply operable to provide the AC signal to the power port;

a measurement device operable to perform the measuring performance characteristics of the charger during testing; and a visual indicator operable to display the performance information to a user indicating whether the charger passed the testing.

14. The method according to claim 13, wherein the charger tester further comprises:

a database for storing the performance information associated with a plurality of chargers.

15. The method according to claim 13, wherein the charger tester further comprises:

a user interface operable to receive information associated with a charger type of the charger to set test parameters that are associated with the charger type and used by the power supply tester.

16. The method according to claim 15, wherein the user interface includes a scanner for reading a label or an identifier associated with the charger.

17. The method according to claim 13, wherein the visual indicator includes one or more LEDs that indicate whether the charger passed the testing.

18. The method of claim 1, wherein the charger tester comprises:

a first port operable to receive an adapter of a charger;

a second port operable to receive a power-end of the charger, the second port configured to provide an alternating current (AC) signal to the charger;

a power supply operable to provide the AC signal to the second port;

a measurement device operable to measure performance information of the charger during testing;

a display for displaying the performance information to a user indicating whether the charger passed the testing.

19. The method of claim 18, wherein the charger tester further comprises:

a switch in communication with a power generator, wherein the switch is configured to communicate the AC signal to the charger and an associated testing circuit in response to the power-end of the charger-and the adapter of the charger connecting to the charger tester; and a timer in communication with the power supply, the timer operable to deactivate the AC signal to the charger in response to a time period elapsing from when the charger began to be tested.

20. The method of claim 18, wherein the charger tester further comprises a database for storing the performance information associated with a plurality of chargers.

* * * * *